(12) United States Patent
Yamashita et al.

(10) Patent No.: US 10,923,487 B2
(45) Date of Patent: Feb. 16, 2021

(54) SEMICONDUCTOR MEMORY DEVICE

(71) Applicant: Toshiba Memory Corporation, Tokyo (JP)

(72) Inventors: Hiroyuki Yamashita, Mie (JP); Shinji Mori, Aichi (JP); Keiichi Sawa, Mie (JP); Kazuhiro Matsuo, Mie (JP); Kazuhisa Matsuda, Mie (JP); Yuta Saito, Mie (JP); Atsushi Takahashi, Mie (JP); Masayuki Tanaka, Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/287,914

(22) Filed: Feb. 27, 2019

(65) Prior Publication Data
US 2020/0091165 A1 Mar. 19, 2020

(30) Foreign Application Priority Data
Sep. 18, 2018 (JP) .................................. 2018-174322

(51) Int. Cl.
*H01L 27/11556* (2017.01)
*H01L 27/11582* (2017.01)

(52) U.S. Cl.
CPC .. *H01L 27/11556* (2013.01); *H01L 27/11582* (2013.01)

(58) Field of Classification Search
CPC ......... H01L 27/11556; H01L 27/11582; H01L 27/11517–11597; H01L 29/40114; H01L 29/7889
See application file for complete search history.

(56) References Cited

U.S. PATENT DOCUMENTS

| | | | | |
|---|---|---|---|---|
| 7,355,238 B2 * | 4/2008 | Takata | ............. | H01L 29/42332 257/314 |
| 9,184,175 B2 | 11/2015 | Dennison et al. | | |
| 9,496,355 B2 * | 11/2016 | Kraus | .................... | B82Y 10/00 |
| 9,837,435 B1 | 12/2017 | Chang et al. | | |
| 2010/0155810 A1 * | 6/2010 | Kim | .................. | H01L 27/11548 257/316 |
| 2011/0260237 A1 * | 10/2011 | Lee | ........................ | B82Y 10/00 257/325 |
| 2014/0061770 A1 * | 3/2014 | Lee | ................... | H01L 29/42324 257/324 |
| 2014/0339624 A1 * | 11/2014 | Ramaswamy | ........ | H01L 29/792 257/326 |

(Continued)

FOREIGN PATENT DOCUMENTS

| | | |
|---|---|---|
| JP | 2014147125 A | 8/2014 |
| JP | 2016514371 A | 5/2016 |
| TW | I605575 B | 11/2017 |

*Primary Examiner* — Eric A. Ward
(74) *Attorney, Agent, or Firm* — Kim & Stewart LLP

(57) ABSTRACT

A semiconductor memory device includes a channel layer and a gate electrode. A first insulating layer is between the semiconductor layer and the gate electrode. A second insulating layer is between the first insulating layer and the gate electrode. A storage region is between the first insulating layer and the second insulating layer. The storage region comprises metal or semiconductor material. A coating layer comprises silicon and nitrogen and surrounds the storage region. The coating layer is between the storage region and the second insulating layer and between the storage region and the first insulating layer.

20 Claims, 19 Drawing Sheets

(56) References Cited

U.S. PATENT DOCUMENTS

| | | | |
|---|---|---|---|
| 2015/0187789 A1* | 7/2015 | Lee | H01L 27/11578 |
| | | | 257/326 |
| 2015/0200199 A1 | 7/2015 | Sakamoto et al. | |
| 2015/0236112 A1* | 8/2015 | Lee | H01L 21/76879 |
| | | | 257/329 |
| 2015/0249093 A1 | 9/2015 | Lee et al. | |
| 2015/0380422 A1* | 12/2015 | Sharangpani | H01L 21/02238 |
| | | | 365/185.17 |
| 2017/0018571 A1 | 1/2017 | Alsmeier | |
| 2017/0250189 A1* | 8/2017 | Itokawa | H01L 29/4916 |
| 2017/0271021 A1 | 9/2017 | Futatsuyama et al. | |
| 2018/0006050 A1* | 1/2018 | Watanabe | H01L 29/7889 |
| 2018/0040623 A1* | 2/2018 | Kanakamedala | |
| | | | H01L 27/11548 |
| 2018/0138190 A1 | 5/2018 | Yasuda | |
| 2019/0139983 A1* | 5/2019 | Lee | H01L 29/518 |

* cited by examiner

SEMICONDUCTOR MEMORY DEVICE

CROSS-REFERENCE TO RELATED APPLICATION

This application is based upon and claims the benefit of priority from Japanese Patent Application No. 2018-174322, filed Sep. 18, 2018, the entire contents of which are incorporated herein by reference.

FIELD

Embodiments described herein relate generally to a semiconductor memory device.

BACKGROUND

One of various types of NAND flash memory cells is a metal-oxide-nitride-oxide-silicon (MONOS) memory cell. In the MONOS memory cell, a silicon nitride layer is sandwiched between silicon oxide layers and functions as a charge storage layer. Data is written by accumulating charges in the silicon nitride layer. The data is erased by discharging the accumulated charges from the silicon nitride layer.

A metal layer may be included in the silicon nitride layer used as a charge storage layer of the MONOS memory cell. When the metal layer is provided, the amount of charge accumulated in the charge storage layer is increased and memory characteristics are improved. However, a metal from the metal layer may diffuse into an insulating layer near the charge storage layer, thereby deteriorating the memory characteristics and decreasing reliability.

DETAILED DESCRIPTION

Figure 1:
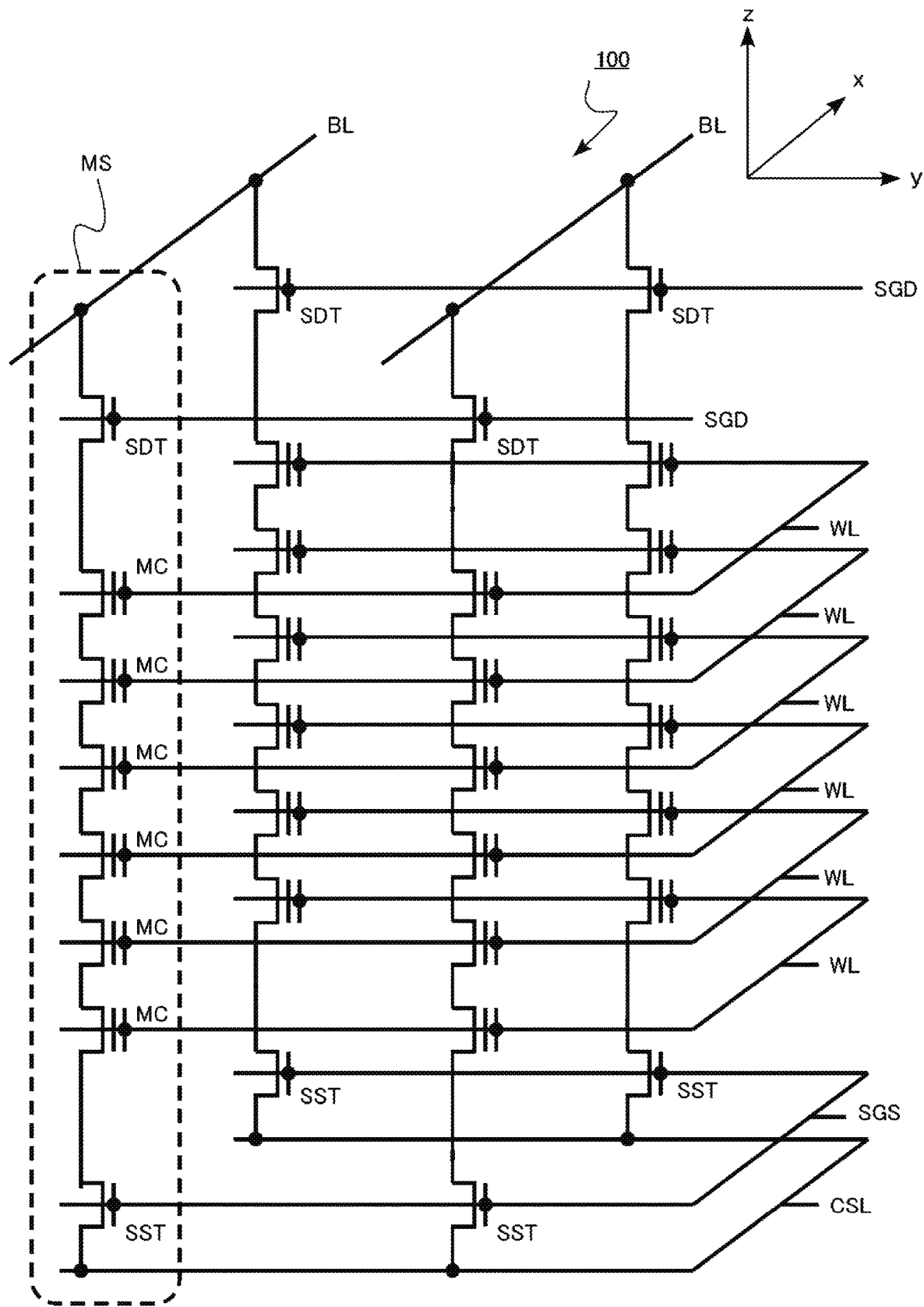
FIG. 1 is a circuit diagram of a memory cell array of a semiconductor memory device according to a first embodiment.

In general, according to one embodiment, a semiconductor memory device comprises a channel layer and a gate electrode. A first insulating layer is between the semiconductor layer and the gate electrode. A second insulating layer is between the first insulating layer and the gate electrode. A storage region is between the first insulating layer and the second insulating layer. The storage region comprises metal or semiconductor material. A coating layer surrounds the storage region. The coating layer comprises silicon and nitrogen. The coating layer is positioned between the storage region and the second insulating layer and between the storage region and the first insulating layer.

Hereinafter, example embodiments will be described with reference to the drawings. In the following description, the same reference numerals are allocated to the same or similar components, and a description of components described once is omitted as appropriate.

For the sake of convenience, the term "on" or "below" may be used herein. The terms "on" or "below" is a term indicating a relative positional relationship in the drawings and should not be understood as defining a positional relationship with respect to gravity.

A qualitative analysis and a quantitative analysis of a chemical composition of each portion of a semiconductor memory device described herein may be carried out, for example, by secondary ion mass spectroscopy (SIMS) or energy dispersive X-ray spectroscopy (EDX). The thickness of each portion of the semiconductor memory device, the distances between the portions, and the like may be measured, for example, by a transmission electron microscope (TEM). A conductivity type of each portion and whether the impurity concentration of each member is high or not may be determined by, for example, scanning capacitance microscopy (SCM).

First Embodiment

A semiconductor memory device according to a first embodiment includes a semiconductor layer, a gate electrode, a first insulating layer provided between the semiconductor layer and the gate electrode, a second insulating layer provided between the first insulating layer and the gate electrode, a region including a metal or a semiconductor provided between the first insulating layer and the second insulating layer, and a coating layer surrounding the region and containing silicon and nitrogen.

The semiconductor memory device according to the first embodiment is a three-dimensional NAND flash memory in which memory cells are three-dimensionally arranged.

Figure 2:
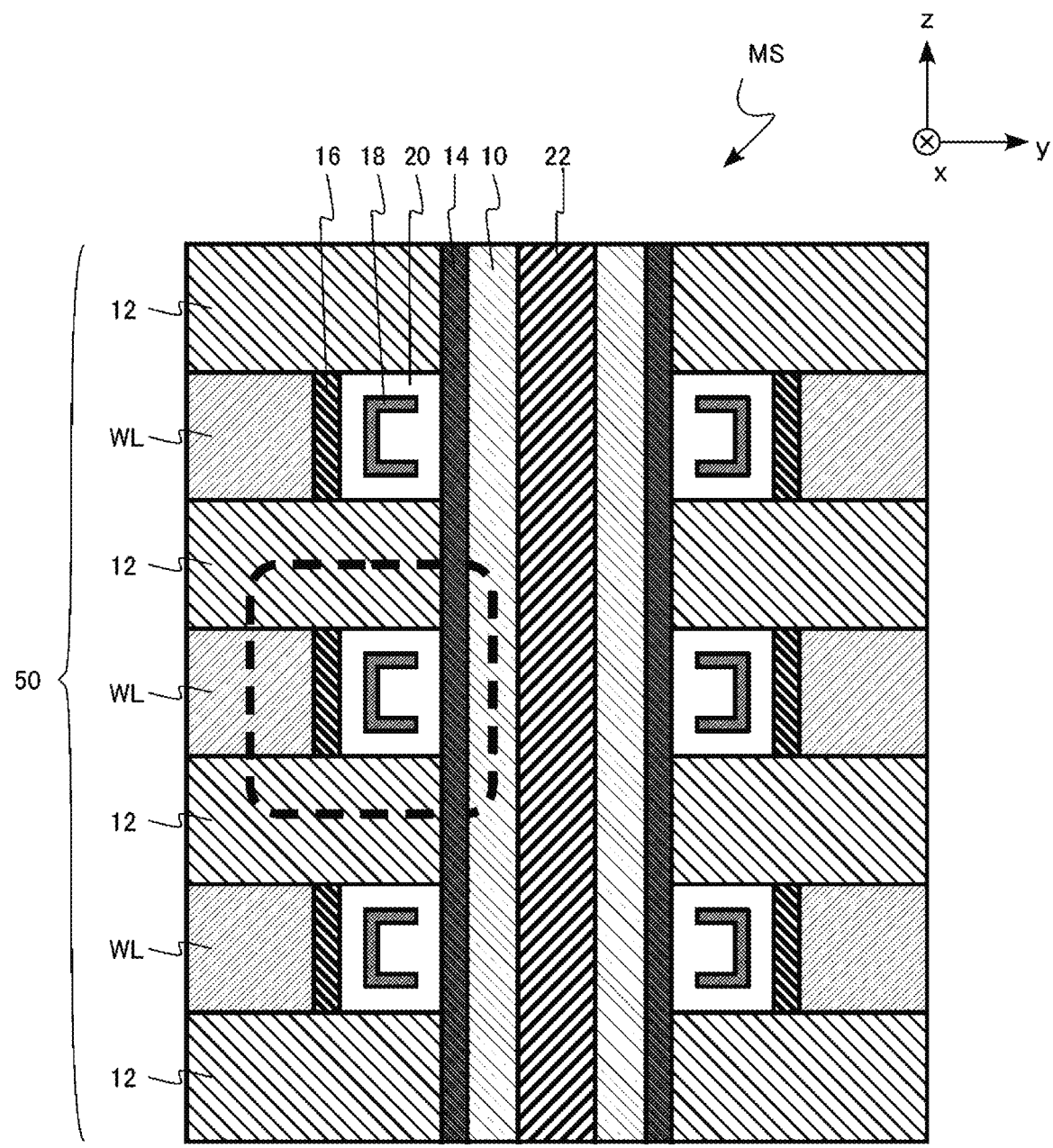
FIG. 2 is a schematic cross-sectional view of a part of a memory string of a semiconductor memory device according to a first embodiment.

FIG. 1 is a circuit diagram of a memory cell array of the semiconductor memory device according to the first embodiment. FIG. 2 is a schematic cross-sectional view of a part of a memory string of the semiconductor memory device according to the first embodiment. FIG. 2 illustrates yz cross sections of a plurality of memory cells MC included in one memory string MS indicated by a dotted line in the memory cell array 100 of FIG. 1.

As illustrated in FIG. 1, the memory cell array 100 of the three-dimensional NAND flash memory according to the first embodiment includes a plurality of word lines WL, a common source line CSL, a source select gate line SGS, a plurality of drain select gate lines SGD, a plurality of bit lines BL, and a plurality of memory strings MS.

As illustrated in FIG. 1, the memory string MS includes a source select transistor SST, a plurality of memory cells MC, and a drain select transistor SDT which are connected in series between the common source line CSL and the bit lines BL. One memory string MS is selected by the bit line BL and the drain select gate line SGD, and one memory cell MC may be selected by the word line WL.

As illustrated in FIG. 2, the memory cell array 100 includes a plurality of word lines WL (conductive layers and gate electrodes), a semiconductor layer 10, a plurality of interlayer insulating layers 12, a tunnel insulating layer 14, a block insulating layer 16, a charge storage region 18, a coating layer 20, and a core insulating layer 22. The plurality of word lines WL and the plurality of interlayer insulating layers 12 form a stacked structure 50. The charge storage region 18 is an example of a region including a metal or a semiconductor.

The word lines WL and the interlayer insulating layers 12 are provided, for example, on a semiconductor substrate (not illustrated).

The word lines WL and the interlayer insulating layers 12 are alternately stacked on the semiconductor substrate in a z-axis direction (a first direction). The plurality of word lines WL and the plurality of interlayer insulating layers 12 form the stacked structure 50.

Each word line WL is a plate shaped (planar layer) conductor. The word lines WL may be formed of, for example, a metal or a semiconductor. The word lines WL may be formed of, for example, tungsten (W). The word lines WL may be considered to function as a control electrode of a memory cell MC. The word lines WL may be considered a gate electrode layer. A thickness of the word line WL in the z-axis direction is, for example, greater than or equal to 20 nm and equal to or less than 40 nm.

The word line WL is an example of a conductive layer and a gate electrode.

The interlayer insulating layer 12 separates the word lines WL. The interlayer insulating layer 12 is formed of, for example, silicon oxide. A thickness of the interlayer insulating layer 12 in the z-axis direction is, for example, greater than or equal to 20 nm and equal to or less than 40 nm.

The core insulating layer 22 is provided inside the stacked structure 50. The core insulating layer 22 extends in the z-axis direction. The core insulating layer 22 penetrates the stacked structure 50. The core insulating layer 22 is surrounded by the semiconductor layer 10. The core insulating layer 22 is formed of, for example, silicon oxide.

The semiconductor layer 10 is provided inside the stacked structure 50. The semiconductor layer 10 extends in the z-axis direction. The semiconductor layer 10 penetrates the stacked structure 50. The semiconductor layer 10 is provided around the core insulating layer 22. The semiconductor layer 10 has, for example, a cylindrical shape.

The semiconductor layer 10 is formed of, for example, an n-type semiconductor. The semiconductor layer 10 is formed of, for example, polycrystalline silicon.

The semiconductor layer 10 functions as a channel of a transistor of the memory cell MC.

The charge storage region 18 is provided between the semiconductor layer 10 and the word line WL. The charge storage region 18 is also provided between the tunnel insulating layer 14 and the block insulating layer 16. The charge storage region 18 surrounds the semiconductor layer 10.

The charge storage region 18 has a function of storing charges therein when an electric field is applied. The charges stored in the charge storage region 18 may be canceled by applying another electric field to the charge storage region 18.

The charge storage region 18 contains at least one material selected from the group consisting of a metal, a metal nitride, a metal oxide, a semiconductor, and a metal semiconductor compound.

The charge storage region 18 includes, for example, a material having a higher electron affinity or a higher work function than that of the coating layer 20.

The charge storage region 18 includes, for example, a metal. The charge storage region 18 includes, for example, ruthenium or titanium.

The charge storage region 18 includes, for example, a metal nitride. The charge storage region 18 includes, for example, titanium nitride or tungsten nitride.

The charge storage region 18 includes, for example, metal oxide. The charge storage region 18 includes, for example, titanium oxide, aluminum oxide, hafnium oxide, zirconium oxide, yttrium oxide, or lanthanum oxide.

The charge storage region 18 includes, for example, a semiconductor. The charge storage region 18 includes, for example, silicon. The charge storage region 18 includes, for example, silicon containing an n-type impurity or a p-type impurity.

The charge storage region 18 includes, for example, a metal semiconductor compound. The charge storage region 18 includes, for example, silicide. The charge storage region 18 includes, for example, titanium silicide, nickel silicide, or tungsten silicide.

The coating layer 20 surrounds the charge storage region 18. A part of the coating layer 20 is provided between the charge storage region 18 and the interlayer insulating layer 12. Another part of the coating layer 20 is provided between the charge storage region 18 and the tunnel insulating layer 14. Still another part of the coating layer 20 is provided between the charge storage region 18 and the block insulating layer 16.

A part of the coating layer 20 is also provided on a side surface of the charge storage region 18. In other words, a part of the coating layer 20 is also provided in a plane including the charge storage region 18.

Since the charge storage region 18 is surrounded by the coating layer 20, the charge storage region 18 is not in direct contact with the interlayer insulating layer 12, the tunnel insulating layer 14, and the block insulating layer 16. The charge storage region 18 is not in direct contact with any insulating layers other than the coating layer 20.

The coating layer 20 has a function of preventing the diffusion of a component, for example, a metal element, from the charge storage region 18 into the insulating layers adjacent the charge storage region 18. At least a part of the coating layer 20 also has a function of storing charges therein when an electric field is applied to the coating layer 20.

The coating layer 20 is an insulating layer containing silicon and nitrogen. The coating layer 20 is formed of, for example, silicon nitride, silicon oxynitride, or carbon-containing silicon oxynitride. The coating layer 20 has a function of storing charges, for example, by trapping charges at a trap level of the coating layer 20.

The coating layer 20 has, for example, a substantially uniform chemical composition. The coating layer 20 is formed of, for example, only silicon nitride. Alternatively, the coating layer 20 is formed of, for example, only silicon oxynitride.

The pairs of charge storage regions 18 and the coating layers 20 are separated from each other by the interlayer insulating layers 12 interposed between memory cells MC that are connected to each other in a vertical direction.

The tunnel insulating layer 14 is provided between the semiconductor layer 10 and the word line WL. The tunnel insulating layer 14 is provided between the semiconductor layer 10 and the coating layer 20.

The tunnel insulating layer 14 has a function of preventing movement of charges between the charge storage region 18 and the semiconductor layer 10. The tunnel insulating layer 14 also has a function of allowing charges to pass through as a tunnel current when the charges are written to the charge storage region 18 or are erased from the charge storage region 18.

The tunnel insulating layer 14 is formed of, for example, silicon oxide.

The block insulating layer 16 is provided between the tunnel insulating layer 14 and the word line WL. The block insulating layer 16 is also provided between the coating layer 20 and the word line WL.

The block insulating layer 16 has a function of preventing movement of charges between the charge storage region 18 and the word line WL.

The block insulating layer 16 is formed of, for example, silicon oxide or aluminum oxide. The block insulating layer 16 has, for example, a stacked layer structure including silicon oxide and aluminum oxide.

The memory cell MC includes the semiconductor layer 10, the tunnel insulating layer 14, the charge storage region 18, the coating layer 20, the block insulating layer 16, and the word line WL. The memory cell MC has a function of storing and maintaining data based on the amount of charges stored in the charge storage region 18 and the coating layer 20.

The memory cell MC of the semiconductor memory device according to the first embodiment has a structure in which the charge storage region 18 of a floating type is added to a charge trapping type charge storage layer having a so-called metal-oxide-nitride-oxide (MONOS) structure.

Figure 3:
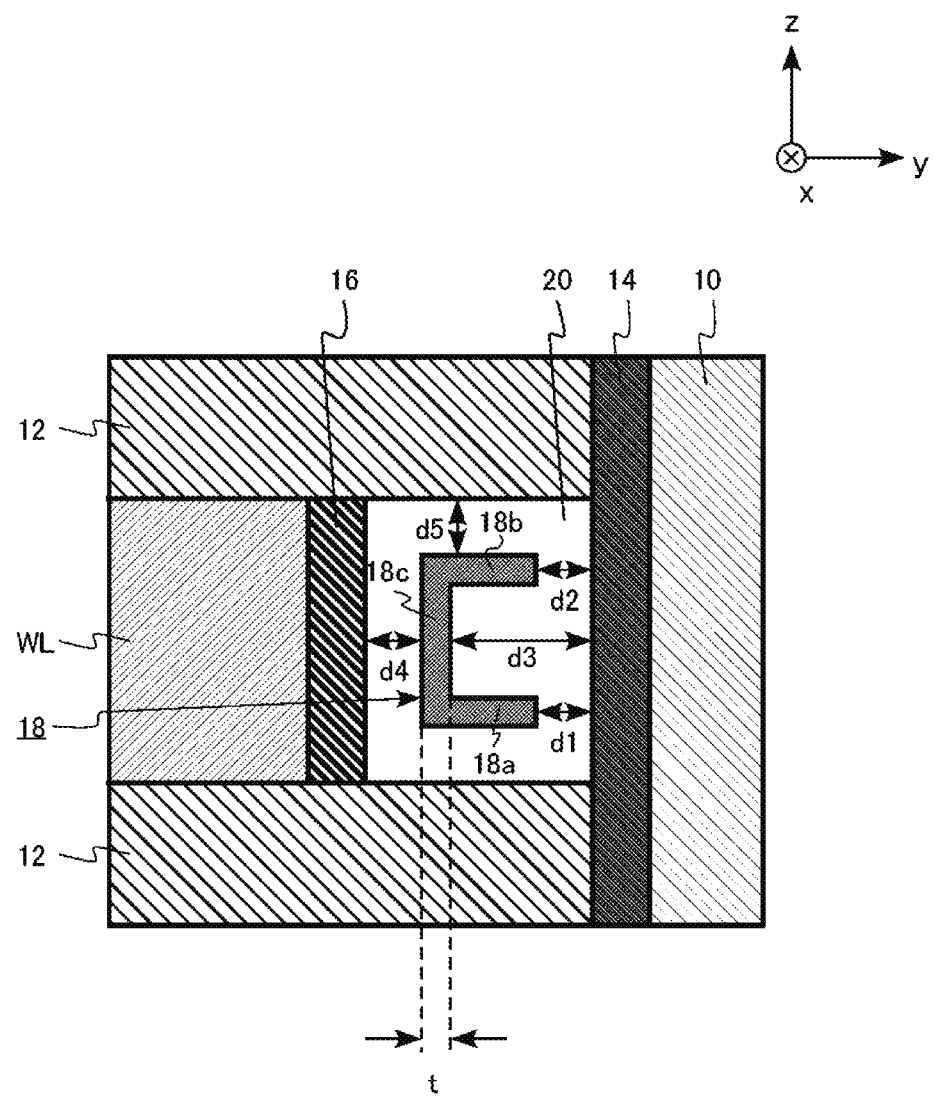
FIG. 3 is an enlarged schematic cross-sectional view of a part of a memory string of a semiconductor memory device according to a first embodiment.

FIG. 3 is an enlarged schematic cross-sectional view of a part of the memory string of the semiconductor memory device according to the first embodiment. FIG. 3 illustrates an area indicated by a dotted line in FIG. 2. In FIG. 3, the illustration of the core insulating layer 22 is omitted. FIG. 3 illustrates an yz cross section of one memory cell MC.

The charge storage region 18 includes a first region 18a, a second region 18b, and a third region 18c. The third region 18c is located between the first region 18a and the second region 18b.

A first distance d1 between the first region 18a and the tunnel insulating layer 14 and a second distance d2 between the second region 18b and the tunnel insulating layer 14 are less than a third distance d3 between the third region 18c and the tunnel insulating layer 14. The first distance d1 and the second distance d2 are, for example, equal to or less than half of the third distance d3.

The charge storage region 18 has a horseshoe shape in the yz cross section. In the yz cross section, both ends of the charge storage region 18 extend toward the tunnel insulating layer 14.

The first distance d1 and the second distance d2 are, for example, greater than or equal to 2 nm and equal to or less than 5 nm. The third distance d3 is, for example, greater than or equal to 4 nm and equal to or less than 10 nm. A thickness t of the charge storage region 18 in a y-axis direction is, for example, greater than or equal to 0.3 nm and equal to or less than 1 nm.

A fourth distance d4 between the charge storage region 18 and the block insulating layer 16 is, for example, greater than or equal to 2 nm and equal to or less than 5 nm. A fifth distance d5 between the charge storage region 18 and the interlayer insulating layer 12 is, for example, greater than or equal to 2 nm or equal to or less than 5 nm.

A thickness of the tunnel insulating layer 14 in the y-axis direction is, for example, greater than or equal to 3 nm and equal to or less than 8 nm. A thickness of the block insulating layer 16 in the y-axis direction is, for example, greater than or equal to 5 nm and equal to or less than 10 nm.

Next, an example of a method of manufacturing a semiconductor memory device according to the first embodiment will be described. In particular, a method of manufacturing a memory string MS including a memory cell MC will be described below.

FIGS. 4 to 15 are schematic cross-sectional views illustrating an example of the method of manufacturing the semiconductor memory device according to the first embodiment.

Figure 4:
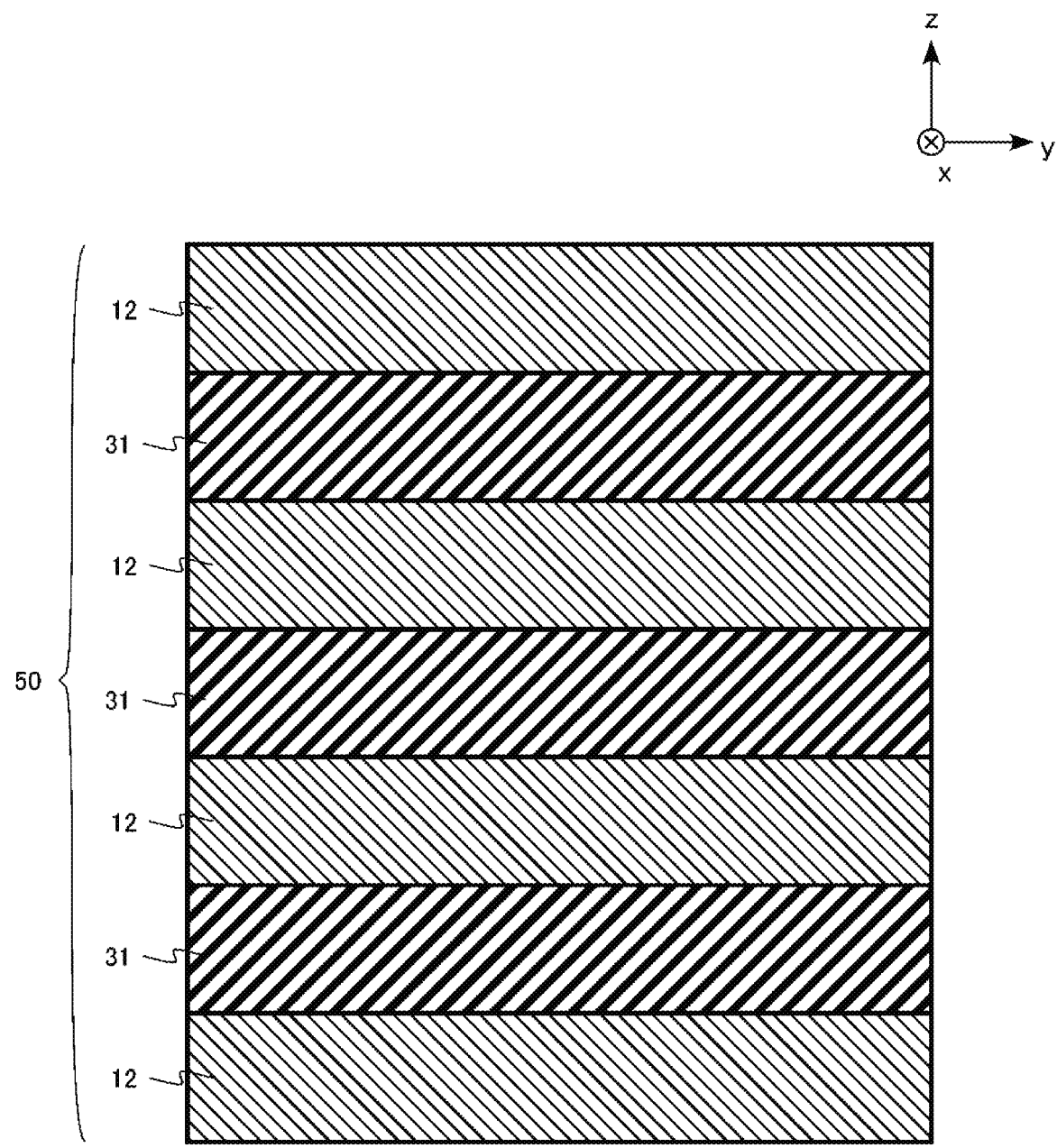
FIGS. 4 to 15 are cross-sectional views depicting aspects of a method of manufacturing a semiconductor memory device according to a first embodiment.

First, the interlayer insulating layer 12 and a sacrificial layer 31 are alternately deposited on a semiconductor substrate (FIG. 4). The interlayer insulating layer 12 and the sacrificial layer 31 are formed by, for example, chemical vapor deposition (CVD). The interlayer insulating layer 12 is formed of, for example, silicon oxide. The sacrificial layer 31 is formed of, for example, silicon nitride.

Figure 5:
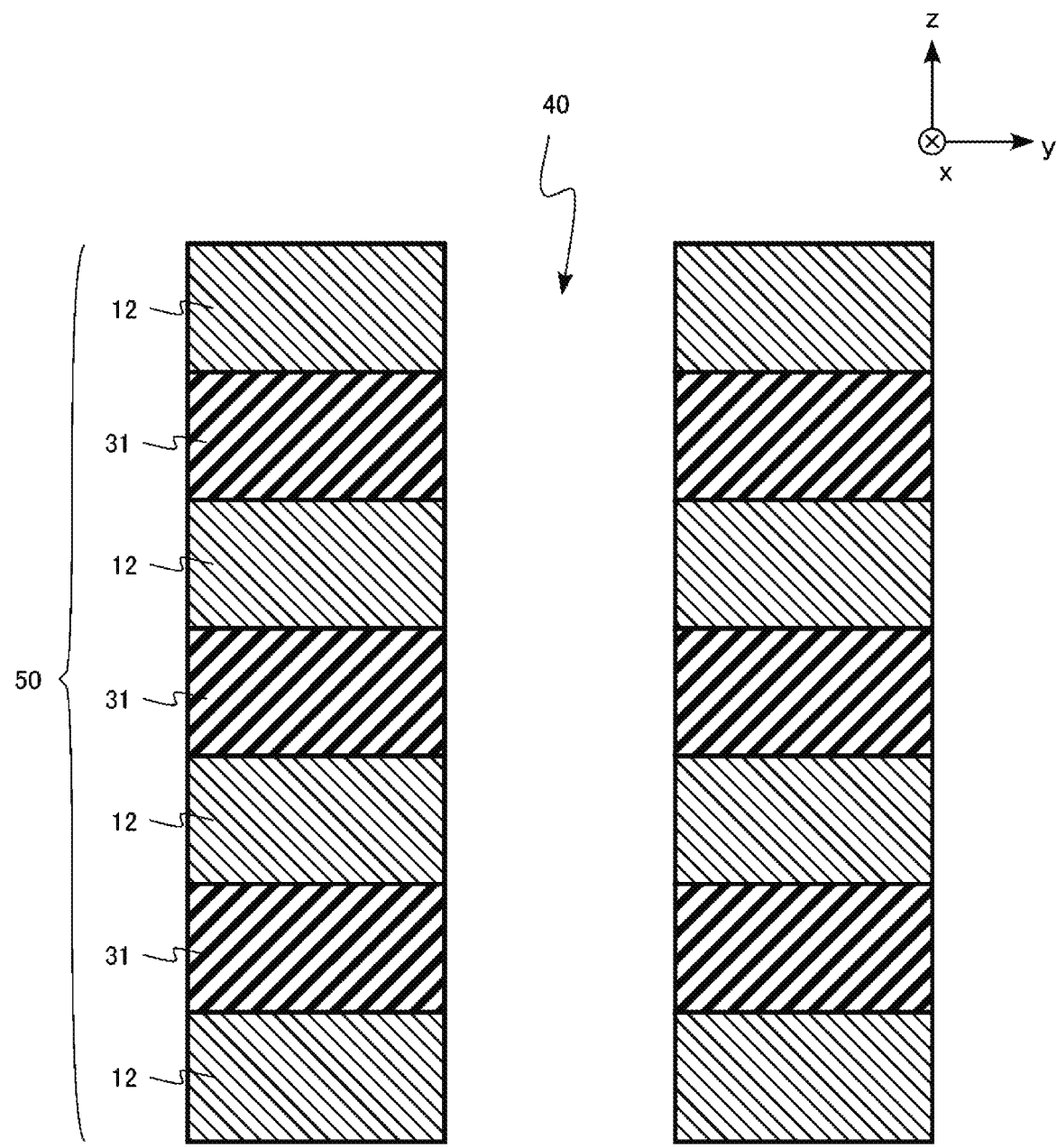

Next, an opening 40 penetrating the interlayer insulating layers 12 and the sacrificial layers 31 is formed (FIG. 5). The opening 40 is formed by, for example, a combination of lithography and reactive ion etching (RIE).

Figure 6:
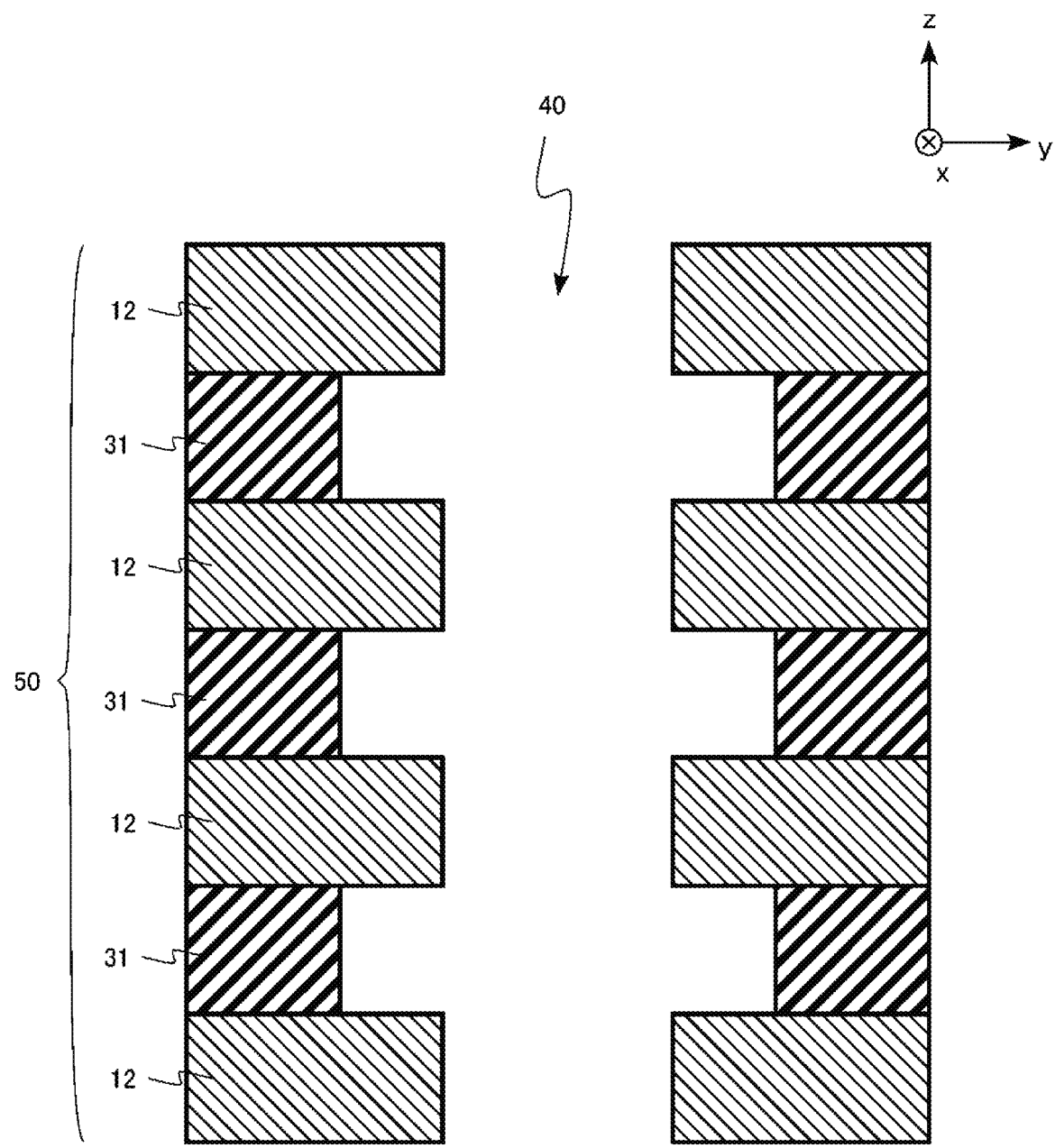

Next, etching is performed to selectively recess the sacrificial layers 31 in the opening 40 back from the interlayer insulating layers 12 (FIG. 6). For recess etching, isotropic etching is used. The isotropic etching is, for example, wet etching or dry etching.

Figure 7:
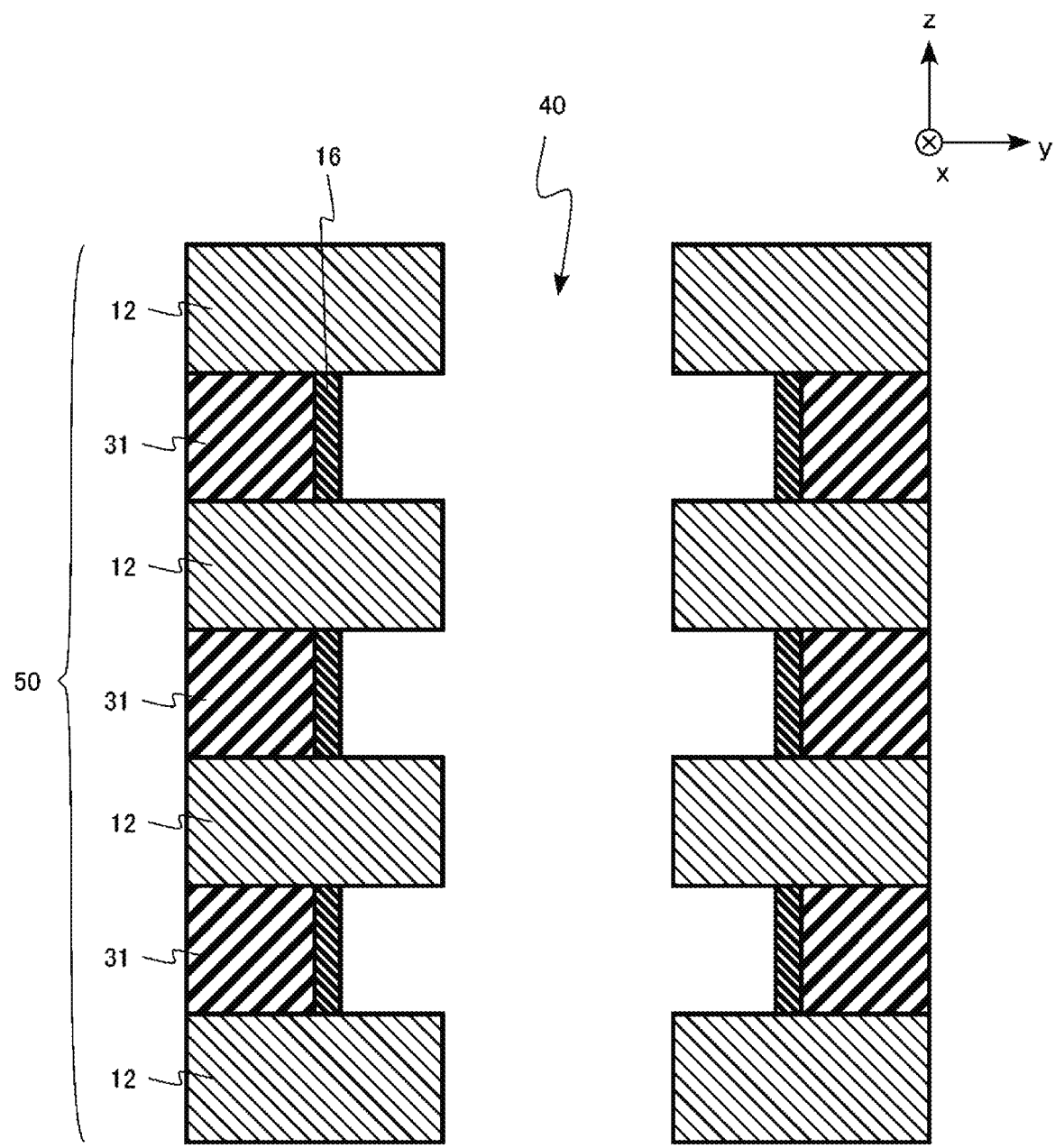

Next, a part of the sacrificial layer 31 is oxidized to form a block insulating layer 16 (FIG. 7). The block insulating layer 16 is formed of silicon oxide.

Figure 8:
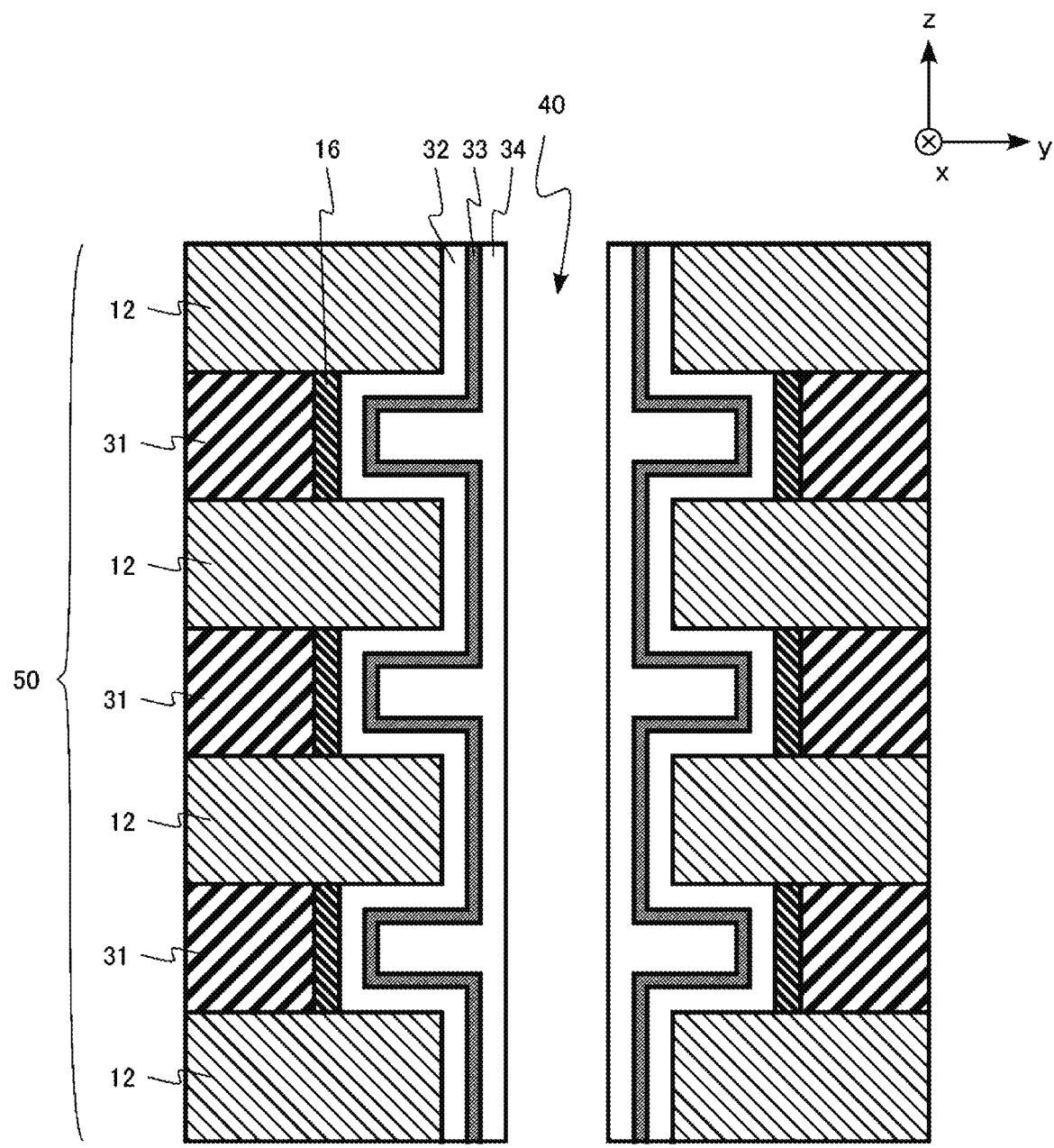

Next, the recessed portion of the sacrifice layer 31 in the opening 40 is filled by depositing, for example, a first silicon nitride film 32, a titanium nitride film 33, and a second silicon nitride film 34 (FIG. 8). The first silicon nitride film 32, the titanium nitride film 33, and the second silicon nitride film 34 are formed by, for example, atomic layer deposition (ALD). A part of the first silicon nitride film 32 and a part of the second silicon nitride film 34 will ultimately become a part of the coating layer 20. A part of the titanium nitride film 33 will ultimately become the charge storage region 18.

Figure 9:
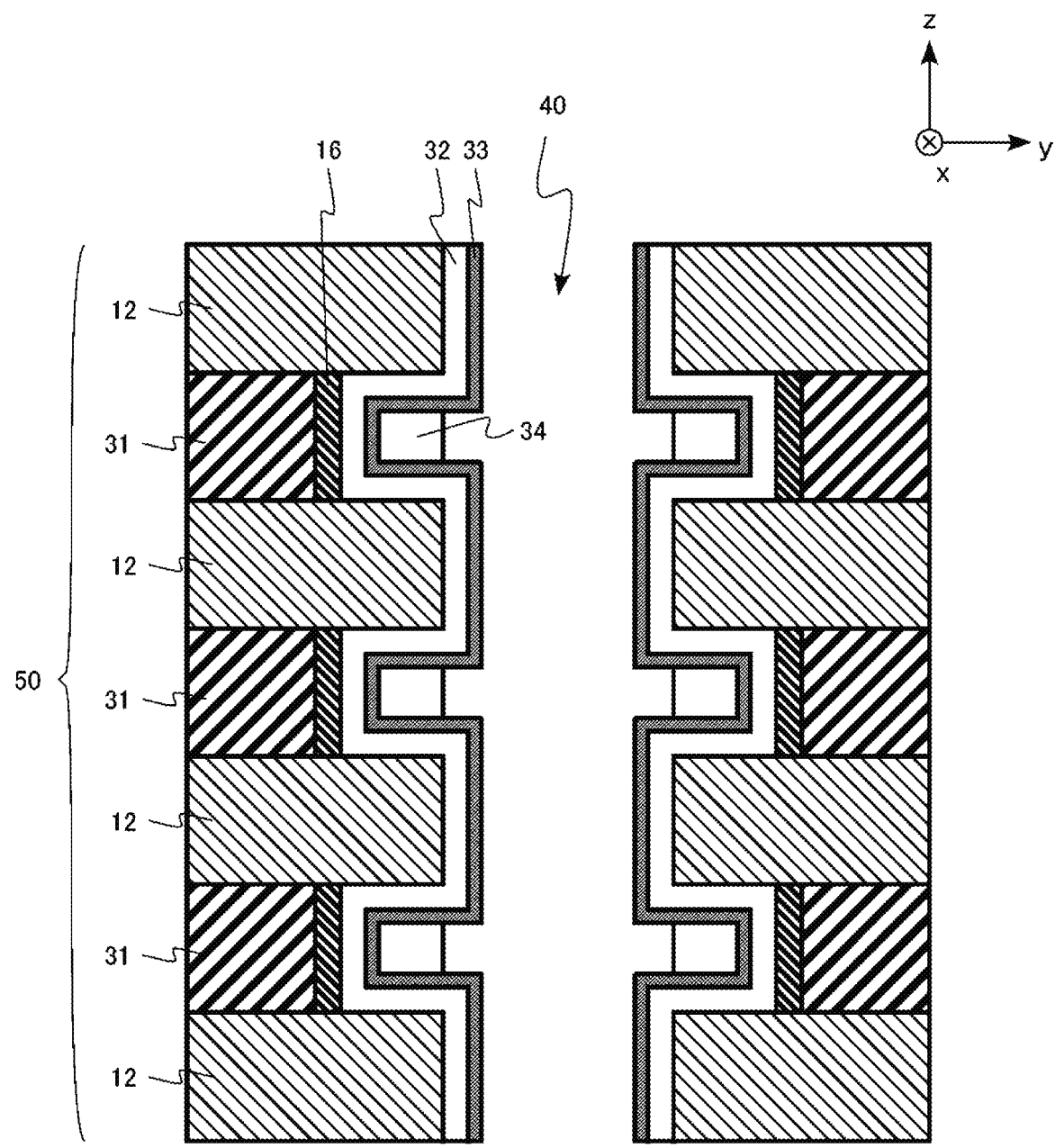

Next, a part of the second silicon nitride film 34 on the side surface of the opening 40 is etched (FIG. 9). For the etching, for example, wet etching is performed using hot phosphoric acid.

Figure 10:
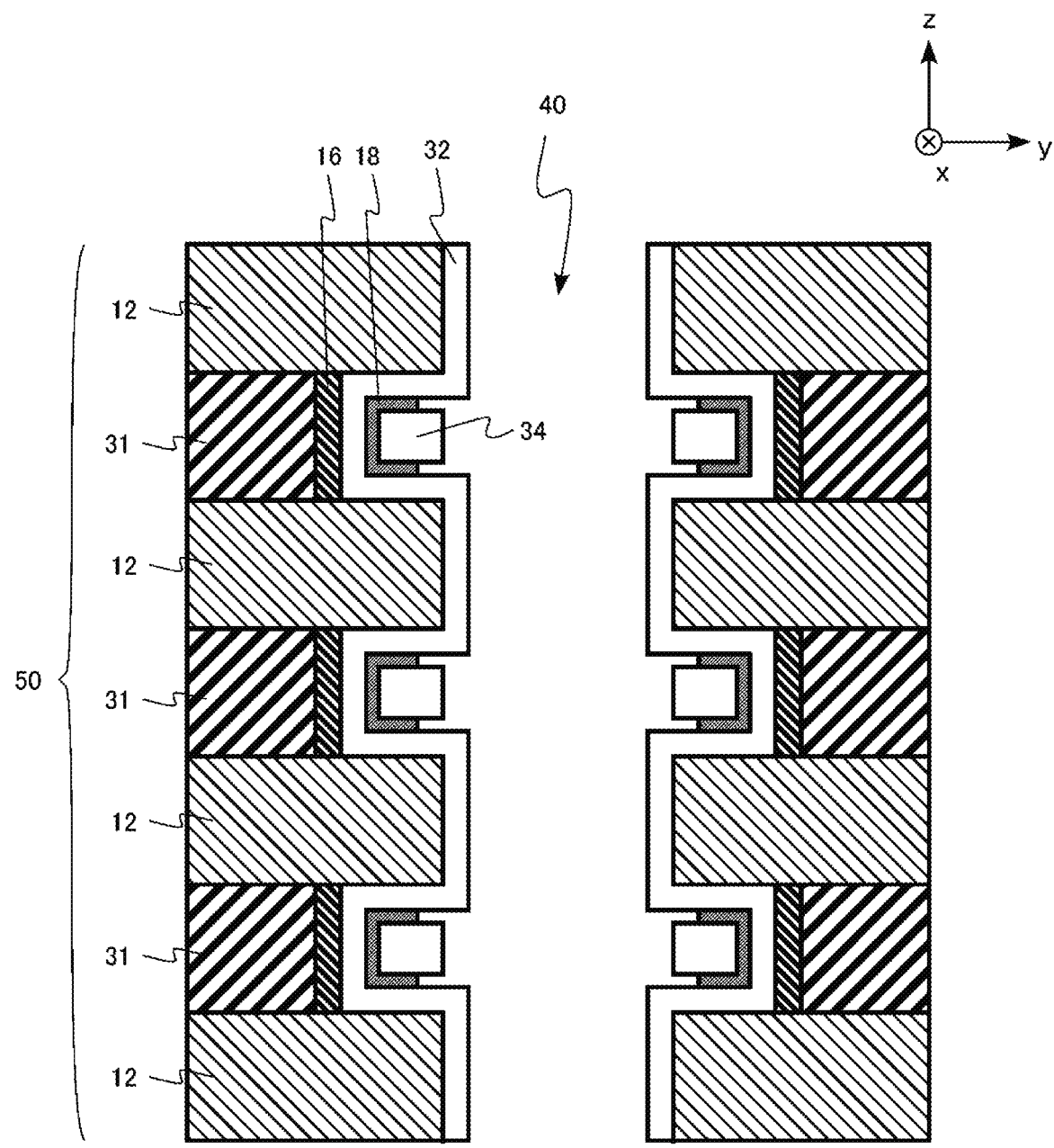

Next, a part of the titanium nitride film 33 is etched (FIG. 10). For the etching, for example, wet etching is performed using a diluted hydrofluoric acid solution. The charge storage region 18 is formed from the titanium nitride film 33.

Figure 11:
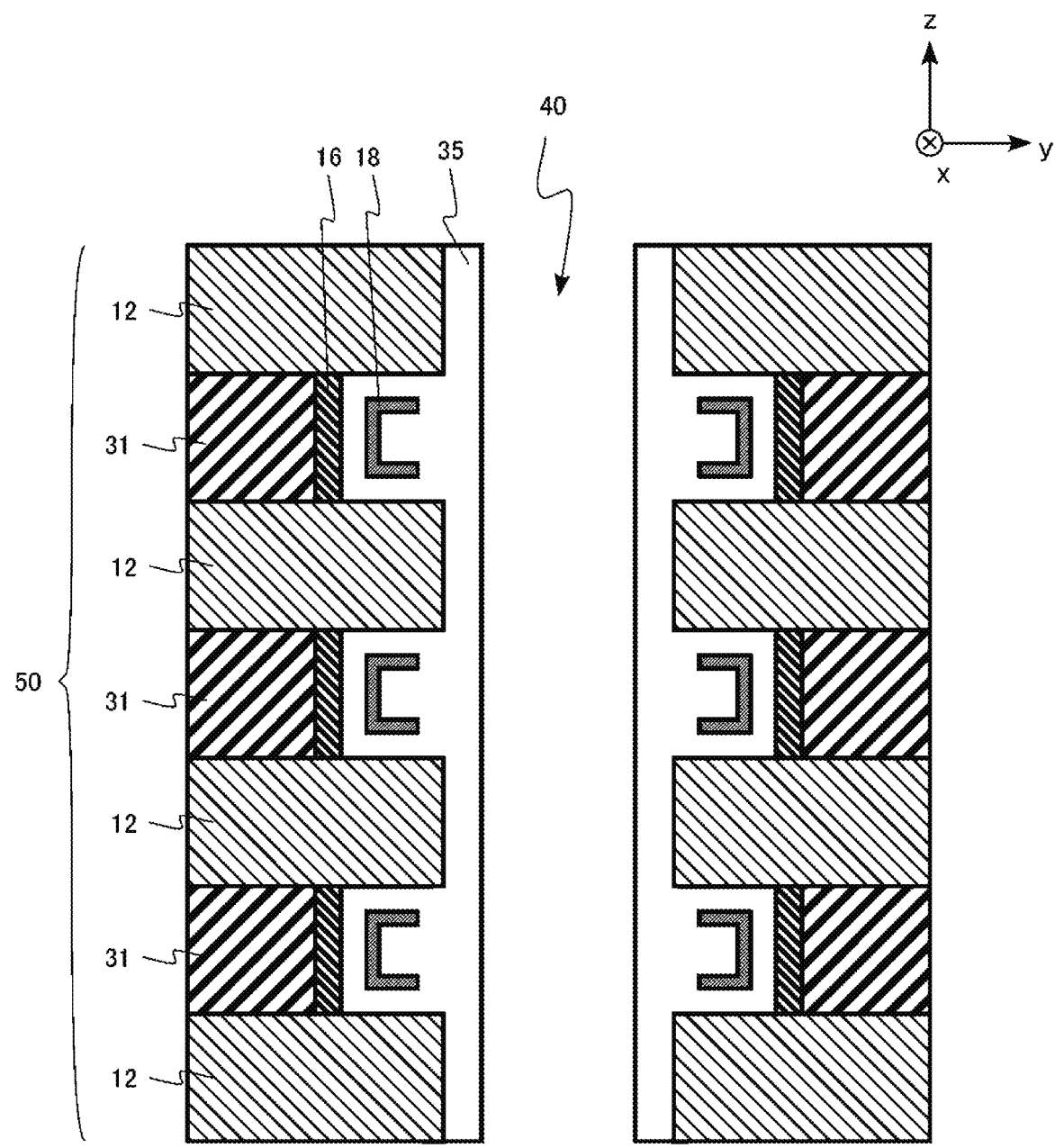

Next, a third silicon nitride film 35 is deposited in the opening 40 (FIG. 11). The third silicon nitride film 35 is formed by, for example, ALD. The charge storage region 18 is surrounded by the silicon nitride film.

Figure 12:
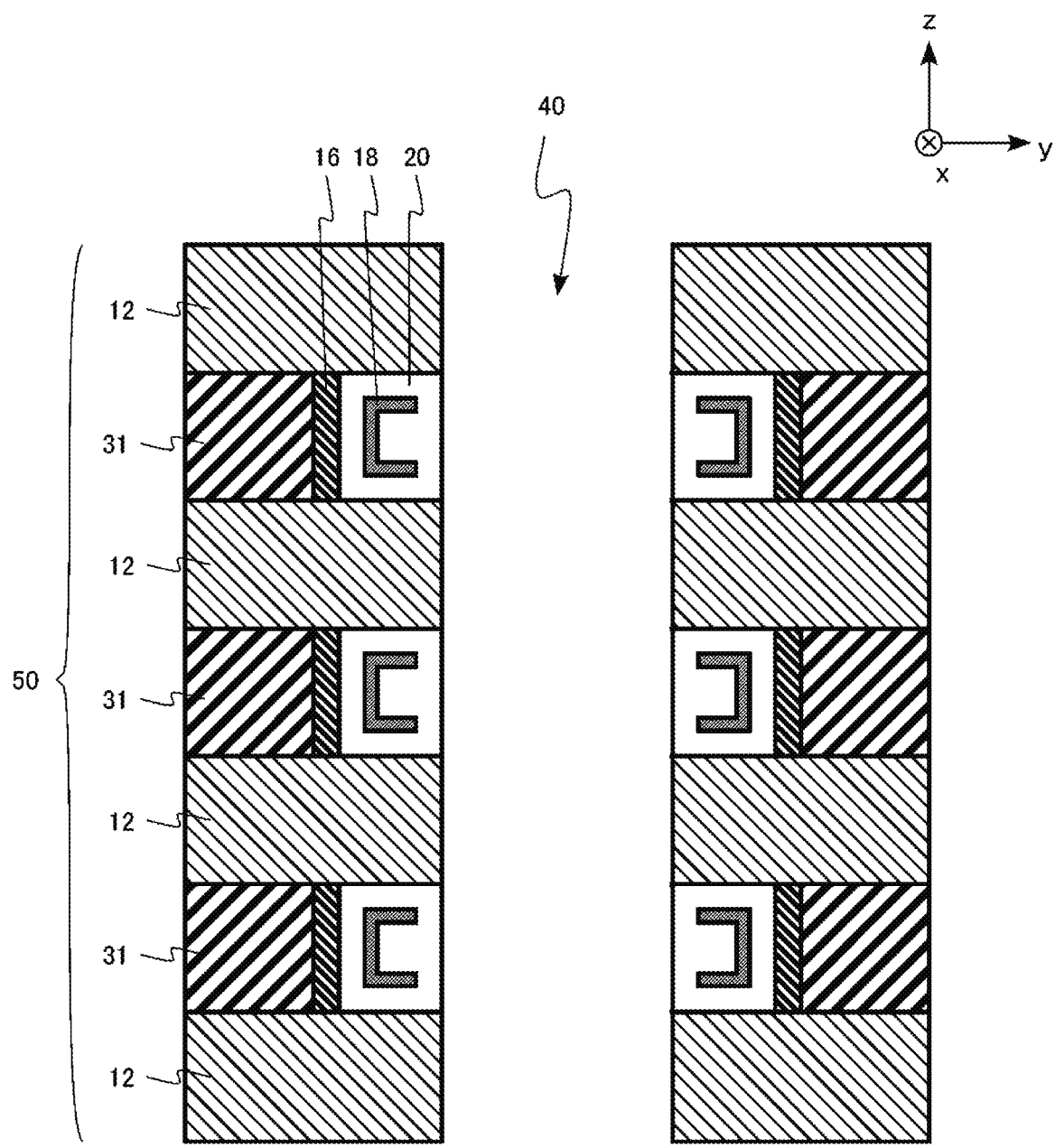

Next, the third silicon nitride film 35 on the side surface of the opening 40 is removed by etching (FIG. 12). Thus, the coating layer 20 is obtained.

Figure 13:
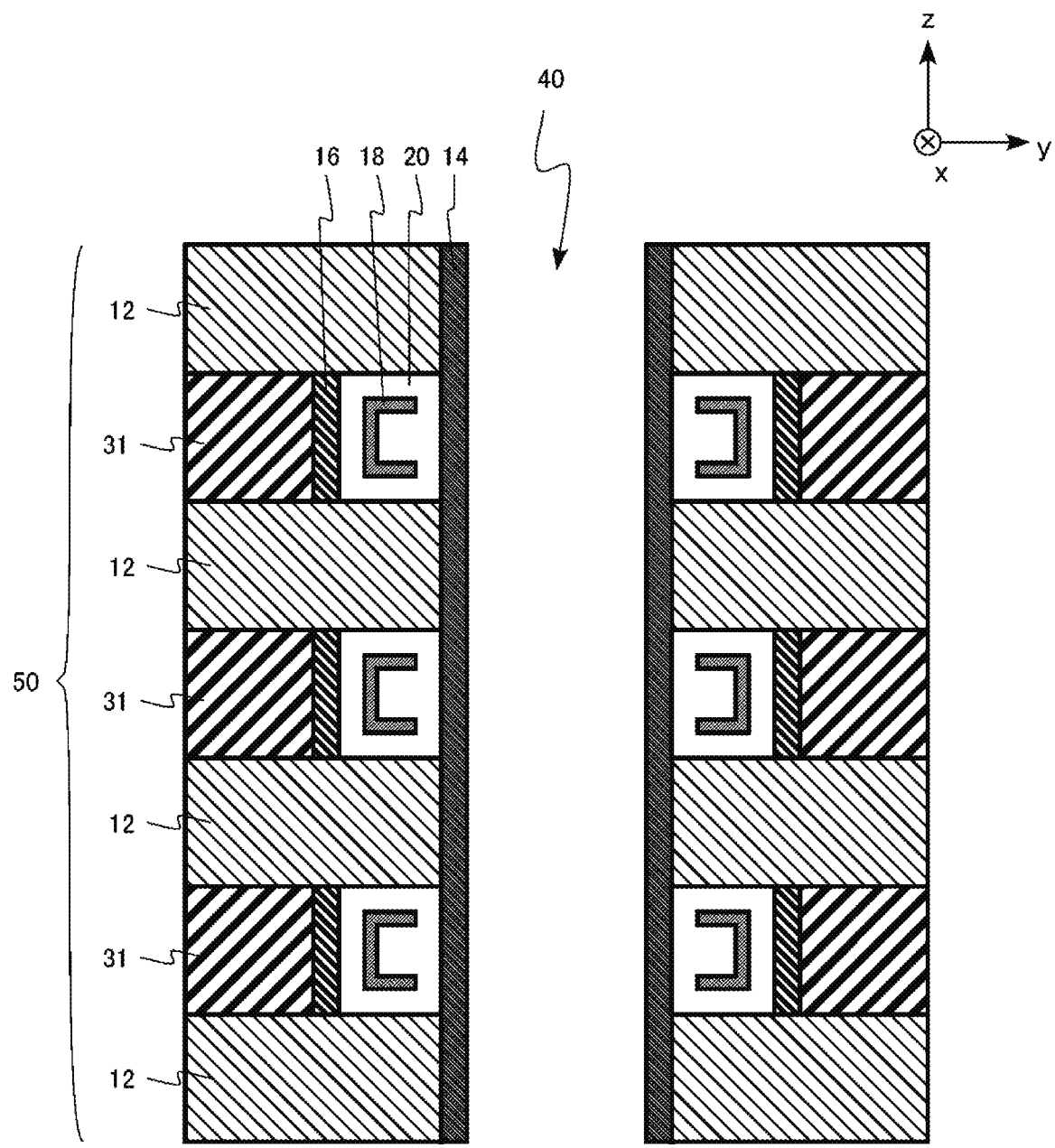

Next, the tunnel insulating layer 14 is formed in the opening 40 (FIG. 13). The tunnel insulating layer 14 is, for example, a silicon oxide film formed by ALD.

Figure 14:
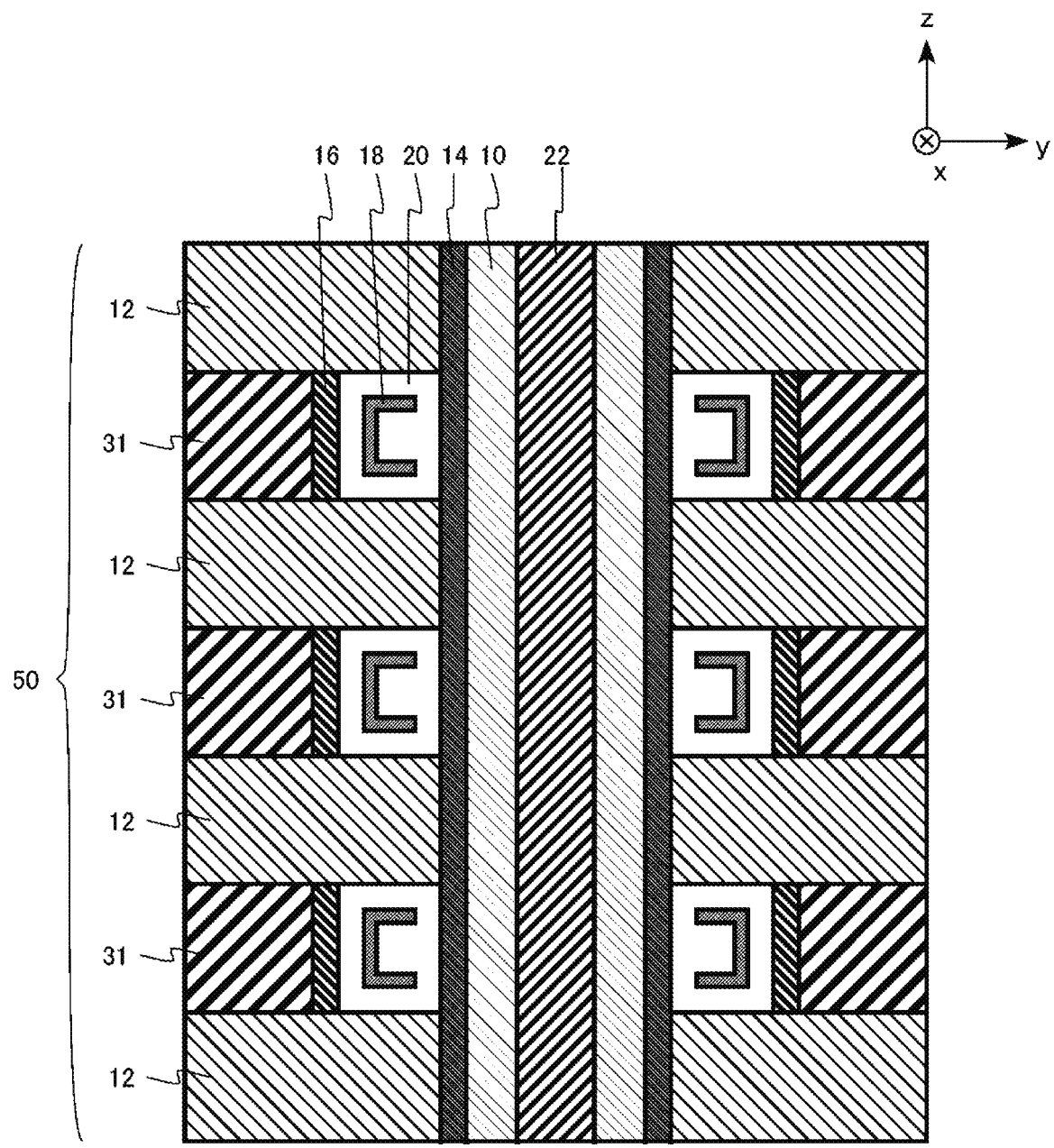

Next, the semiconductor layer 10 and the core insulating layer 22 are deposited in the opening 40 (FIG. 14). The semiconductor layer 10 and the core insulating layer 22 are formed by, for example, CVD.

The semiconductor layer 10 is formed of, for example, polycrystalline silicon doped with an n-type impurity. The n-type impurity is, for example, phosphorus or arsenic. The core insulating layer 22 is formed of, for example, silicon oxide.

Figure 15:
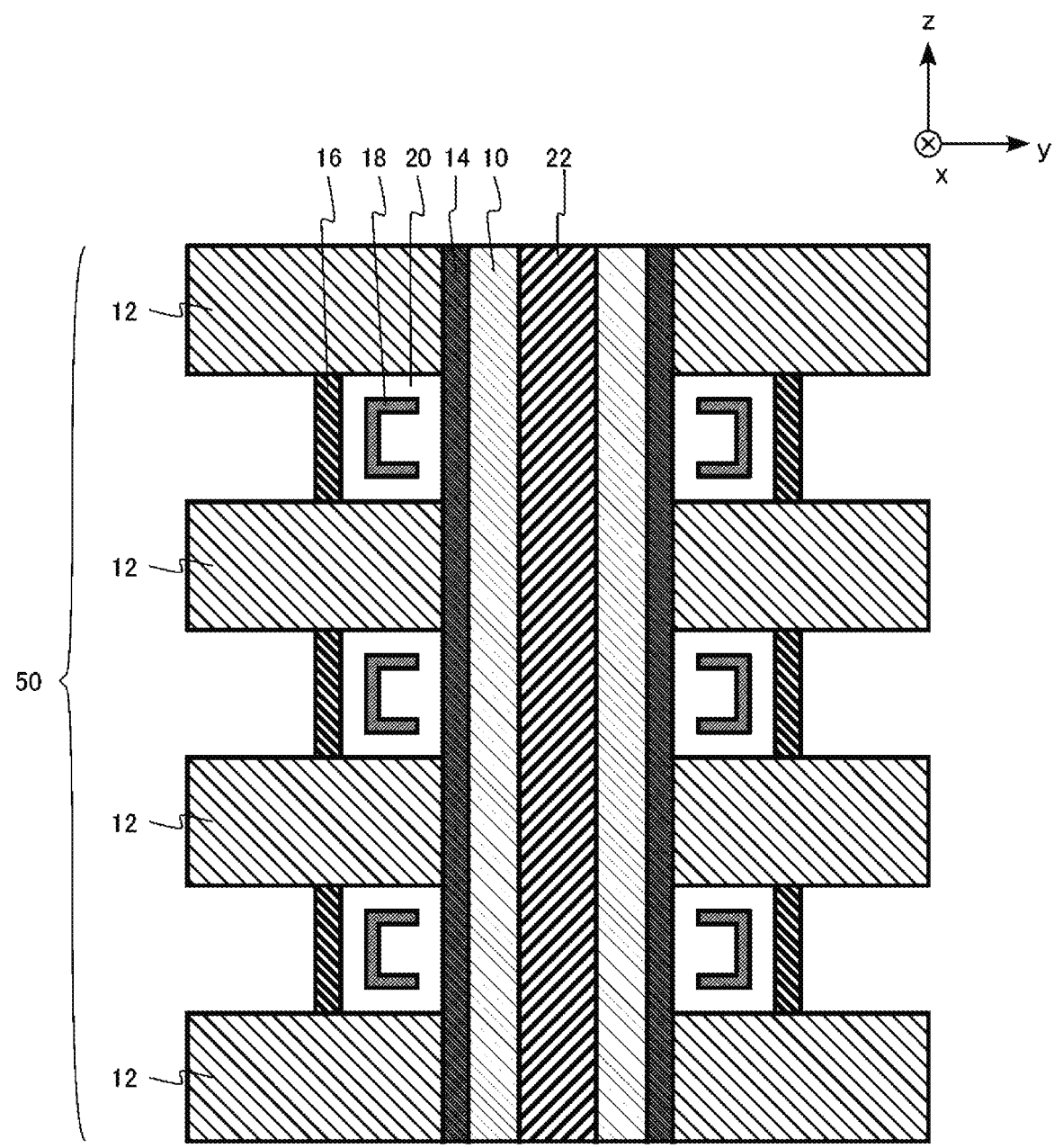

Next, the sacrificial layer 31 is selectively etched and removed (FIG. 15). The etching of the sacrificial layer 31 is performed, for example, by wet etching using hot phosphoric acid.

Next, a material for the word lines WL is embedded in the spaces from which the sacrifice layer 31 was removed. The material for the word line WL is embedded by CVD, for example. The material of the word line WL is, for example, tungsten (W).

The semiconductor memory device according to the first embodiment illustrated in FIG. 2 is manufactured by the above manufacturing method.

Next, an operation and effects of the semiconductor memory device according to the first embodiment will be described.

The memory cell MC of the three-dimensional NAND flash memory of the first embodiment has a structure in which a charge storage region 18 of a floating type is added to a charge trapping type charge storage layer having the MONOS structure. Here, the coating layer 20 corresponds to the charge trapping type charge storage layer. Due to the addition of the charge storage region 18 of a floating type, the amount of charge storable in the memory cell MC increases and memory characteristics are improved.

For example, a case in which the charge storage region 18 is in direct contact with the block insulating layer 16, the tunnel insulating layer 14, or the interlayer insulating layer 12 adjacent thereto will be considered below. In this case, when writing or erasing repeatedly (this operation is referred to as cycle stress in some contexts) on the memory cell MC, a constituent element, for example a metal element, of the charge storage region 18 may diffuse into an insulating layer which is in contact with the charge storage region 18 and thus the memory characteristic may deteriorate. Accordingly, the reliability of the semiconductor memory device may decrease.

Figure 16:
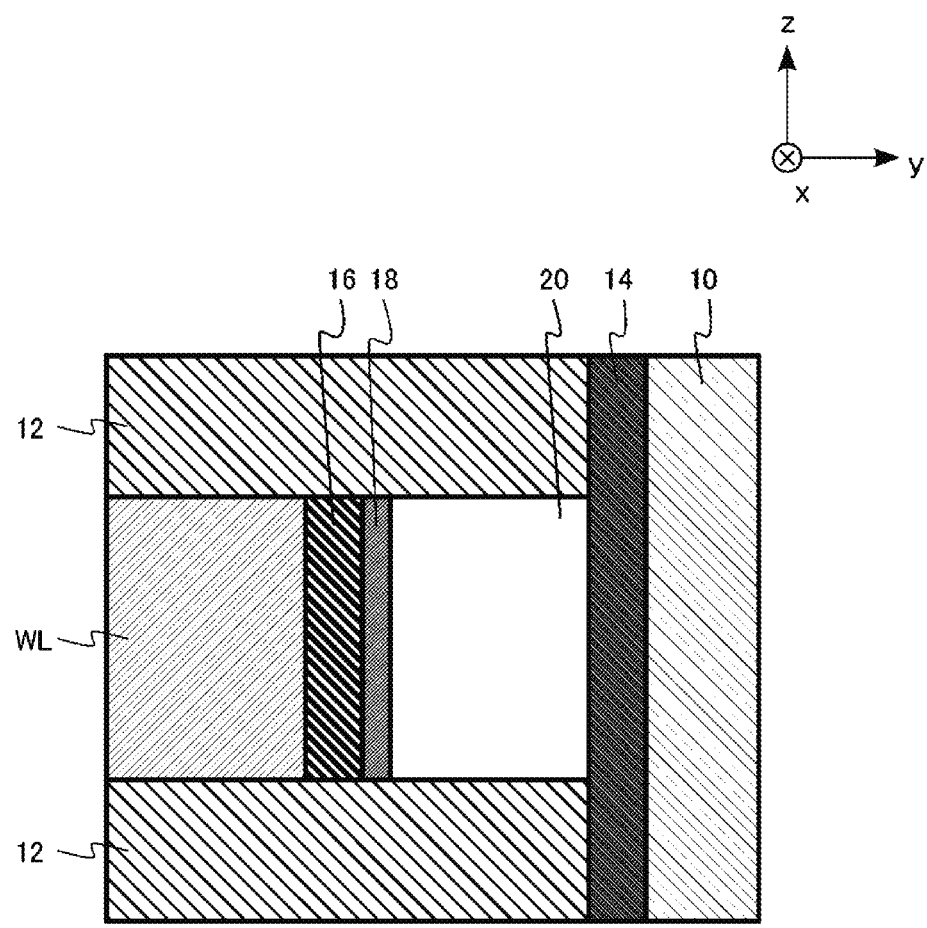
FIG. 16 is an enlarged schematic cross-sectional view of a part of a memory string of a semiconductor memory device according to a first comparative example.
Figure 17:
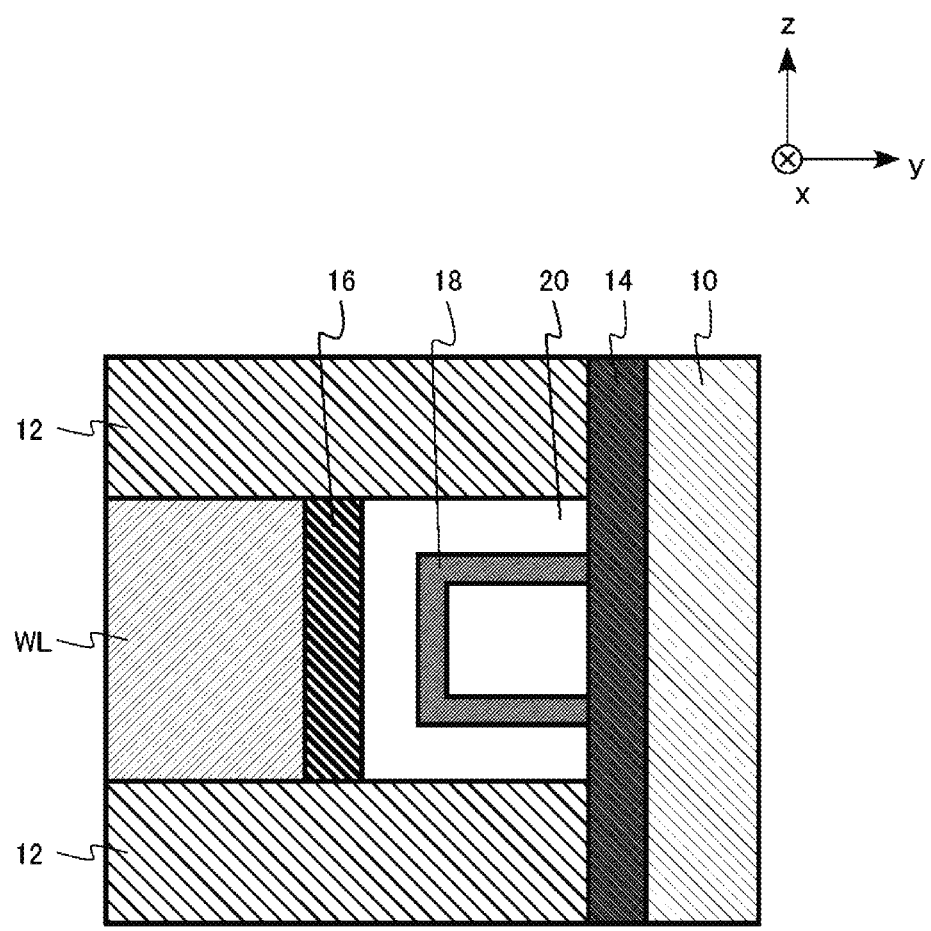
FIG. 17 is an enlarged schematic cross-sectional view of a part of a memory string of a semiconductor memory device according to a second comparative example.
Figure 18:
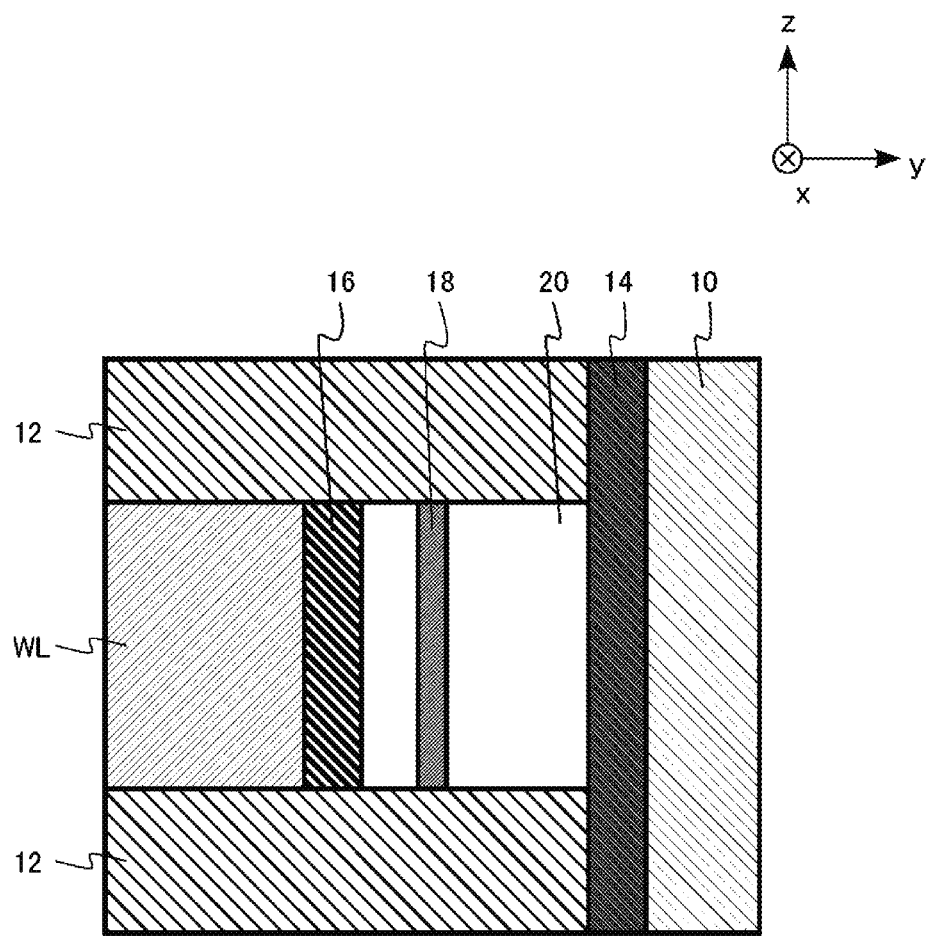
FIG. 18 is an enlarged schematic cross-sectional view of a part of a memory string of a semiconductor memory device according to a third comparative example.

FIG. 16 is an enlarged schematic cross-sectional view of a part of a memory string of a semiconductor memory device according to a first comparative example. FIG. 17 is an enlarged schematic cross-sectional view of a part of a memory string of a semiconductor memory device according to a second comparative example. FIG. 18 is an enlarged schematic cross-sectional view of apart of a memory string of a semiconductor memory device according to a third comparative example. FIGS. 16, 17, and 18 are diagrams corresponding to FIG. 3 illustrating the semiconductor memory device according to the first embodiment.

The semiconductor memory device according to the first comparative example illustrated in FIG. 16 is different from the semiconductor memory device according to the first embodiment in that the charge storage region 18 is in direct contact with the block insulating layer 16.

In the first comparative example, leakage current between the charge storage region 18 and the word line WL may increase due to the diffusion of a metal element into the block insulating layer 16 caused by the cycle stress. When the leakage current between the charge storage region 18 and the word line WL increases, writing/erasing characteristics or data retention characteristics of a memory cell deteriorate. Accordingly, the reliability of the semiconductor memory device deteriorates.

The semiconductor memory device according to the second comparative example illustrated in FIG. 17 is different from a semiconductor memory device according to the first embodiment in that the charge storage region 18 is in direct contact with the tunnel insulating layer 14.

In the second comparative example, leakage current, so-called stress induced leakage current (SILC), flows through the tunnel insulating layer 14 in a low electric field due to the diffusion of a metal element caused by the cycle stress. For this reason, data retention characteristic of a memory cell deteriorates. Accordingly, the reliability of the semiconductor memory device deteriorates.

The semiconductor memory device according to the third comparative example illustrated in FIG. 18 is different from the semiconductor memory device according to the first embodiment, in that the charge storage region 18 is in direct contact with the interlayer insulating layer 12.

In the third comparative example, charges are likely to escape to the word line WL or the semiconductor layer 10 via the interlayer insulating layer 12 due to the diffusion of a metal element caused by the cycle stress. For this reason, writing/erasing characteristics or data retention characteristics of a memory cell deteriorates. Accordingly, the reliability of the semiconductor memory device deteriorates.

In the semiconductor memory device according to the first embodiment, the charge storage region 18 is surrounded by a coating layer 20 containing silicon and nitrogen. In other words, the charge storage region 18 is not in direct contact with the block insulating layer 16, the tunnel insulating layer 14, and the interlayer insulating layers 12.

The coating layer 20 has a function of preventing the diffusion of a constituent element, for example a metal element, from the charge storage region 18. This can prevent the diffusion of a metal element into the block insulating layer 16, the tunnel insulating layer 14, and/or the interlayer insulating layer 12. Accordingly, deterioration in the characteristics of the memory cell can be prevented. Therefore, the resulting semiconductor memory device has improved reliability.

As illustrated in FIG. 3, the charge storage region 18 of the semiconductor memory device according to the first embodiment includes the first region 18a, the second region 18b, and the third region 18c. The first distance d1 between the first region 18a and the tunnel insulating layer 14 and the second distance d2 between the second region 18b and the tunnel insulating layer 14 are less than the third distance d3 between the third region 18c and the tunnel insulating layer 14.

Writing/erasing characteristics of the memory cell may be improved by providing the first region 18a and the second region 18b close to tunnel insulating layer 14 where an electric field is easily concentrated. On the other hand, data retention characteristics of the memory cell may be improved by increasing the third distance d3 between the third region 18c and the tunnel insulating layer 14.

The charge storage region 18 has a horseshoe shape and thus the volume and surface area thereof increase. For this reason, the amount of storable and retainable charges increases and thus the threshold voltage range for writing/erasing increases, which improves the writing/erasing characteristics of the semiconductor memory device. Data retention characteristics of the memory cell are improved.

When the charge storage region 18 has a horseshoe shape, the third distance d3 between the third region 18c and the tunnel insulating layer 14 increases. This can prevent the diffusion of a constituent element, for example a metal element, of the charge storage region 18 into the tunnel insulating layer 14. The volume of the charge storage region 18 is less than that when the distance between the charge storage region 18 and the tunnel insulating layer 14 is maintained to be the same as the first distance d1. The total amount of the constituent element of the charge storage region 18 is reduced, and the diffusion into the tunnel insulating layer 14 is prevented.

The charge storage region 18 preferably contains a material having a higher electron affinity or a higher work function than that of the coating layer 20. The coating layer 20, the block insulating layer 16, the tunnel insulating layer 14, and the interlayer insulating layer 12 each have a higher barrier against electrons than the charge storage region 18A, and thus, data retention characteristics of the semiconductor memory device is improved.

For example, when the coating layer 20 is formed of silicon nitride, titanium oxide, titanium nitride, or ruthenium have a higher electron affinity or a higher work function than silicon nitride.

The charge storage region 18 is preferably formed of a metal or a metal nitride. The amount of storable and retainable charge is further increased and thus the threshold voltage range for writing/erasing increases, which improves the writing/erasing characteristics of the semiconductor memory device. Data retention of the memory cell is improved.

The semiconductor memory device according to the first embodiment has a structure in which the pairs of charge storage regions 18 and the coating layers 20 are separated from each other by interposing the interlayer insulating layer 12 between memory cells MC that are connected to each other in the vertical direction. This can prevent the leakage of charges into the adjacent memory cells and thus improve the data retention of the semiconductor memory device.

Since the leakage of charges into the adjacent memory cells is prevented, the interlayer insulating layer 12 can be formed of a thinner film. Thus, the degree of integration (density) of the memory cells can be improved because the height of the stacked structure 50 is uniform.

As illustrated in FIG. 13, in the semiconductor memory device according to the first embodiment, the charge storage region 18 containing, for example, a metal element is not directly exposed when the tunnel insulating layer 14 is formed. Thus, metal contamination of the tunnel insulating layer 14 is prevented, and the tunnel insulating layer 14 of high quality can be formed. Accordingly, the resulting semiconductor memory device has improved reliability.

As described above, in the semiconductor memory device according to the first embodiment, the charge storage region 18 is surrounded by a coating layer 20, which can prevent the diffusion of an element from the charge storage region 18 into the insulating layers. Accordingly, the resulting semiconductor memory device has improved reliability.

Second Embodiment

A semiconductor memory device according to a second embodiment is different from that of the first embodiment in that the charge storage region does not include a first region, a second region, and a third region. A description of parts of the second embodiment that is the same as those of the first embodiment will be omitted below.

Figure 19:
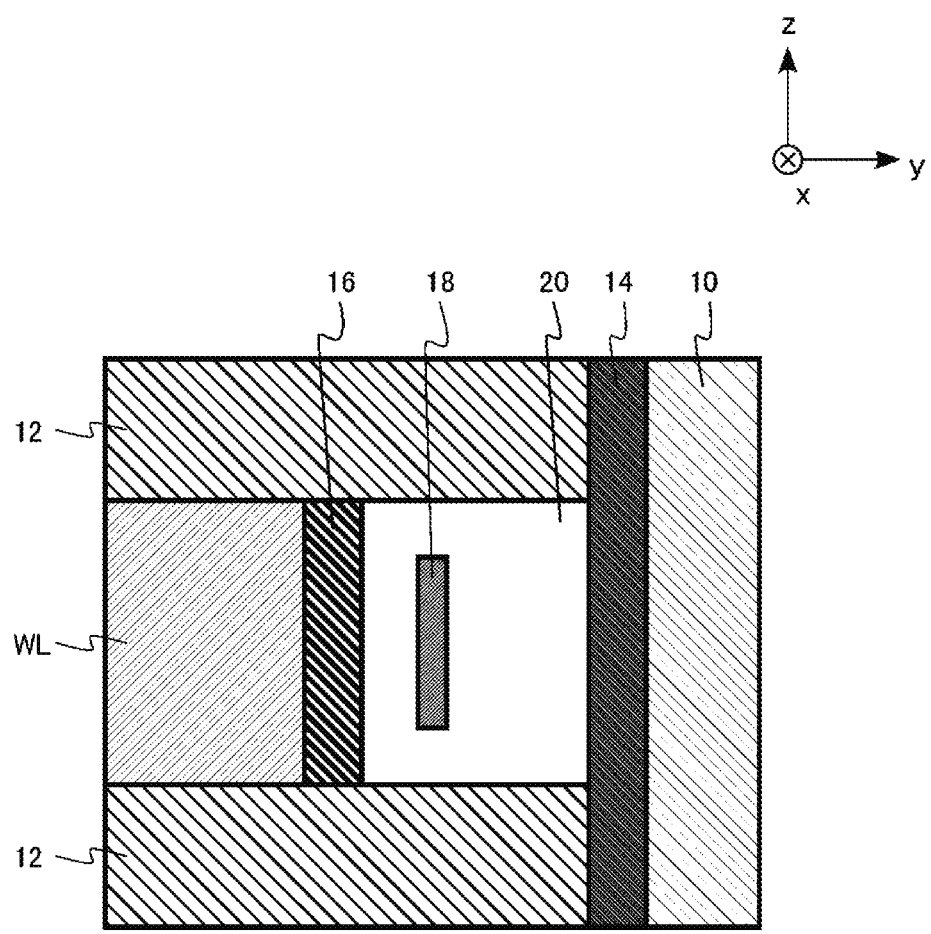
FIG. 19 is an enlarged schematic cross-sectional view of a part of a memory string of a semiconductor memory device according to a second embodiment.

FIG. 19 is an enlarged schematic sectional view of a part of a memory string of a semiconductor memory device according to the second embodiment. FIG. 19 is a diagram corresponding to FIG. 3 but illustrating the semiconductor memory device according to the second embodiment instead of the first embodiment.

A charge storage region 18 of the semiconductor memory device according to the second embodiment has a rectangular shape on an yz cross section. The charge storage region 18 does not include the first region 18a, the second region 18b, and the third region 18c.

As described above, similar to the first embodiment, in the semiconductor memory device according to the second embodiment, the charge storage region 18 is surrounded by the coating layer 20, which can prevent the diffusion of an element of the charge storage region into insulating layers. Accordingly, the resulting semiconductor memory device has improved reliability.

While a three-dimensional NAND flash memory in which memory cells are three-dimensionally arranged has been described above as an example in the first and second embodiments, the present disclosure is also applicable to a two-dimensional NAND flash memory.

While certain embodiments have been described above, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device, comprising:
    a channel layer;
    a gate electrode;
    a first insulating layer between the channel layer and the gate electrode;
    a second insulating layer between the first insulating layer and the gate electrode;
    a storage region between the first insulating layer and the second insulating layer and comprising metal or semiconductor material, the storage region including a first region, a second region, and a third region between the first region and the second region; and
    a coating layer surrounding the storage region and comprising silicon and nitrogen, the coating layer being between the storage region and the second insulating layer and between the storage region and the first insulating layer, and contacting the first insulating layer, wherein
    a thickness of the coating layer between the first region and the first insulating layer is less than a thickness of the coating layer between the third region and the first insulating layer, and
    a thickness of the coating layer between the second region and the first insulating layer is less than the thickness of the coating layer between the third region and the first insulating layer.

2. The semiconductor memory device according to claim 1, wherein the storage region comprises at least one of a metal nitride or a metal oxide.

3. The semiconductor memory device according to claim 1, wherein the storage region is metal.

4. The semiconductor memory device according to claim 1, wherein the storage region comprises a material having a higher electron affinity or a higher work function than that of the coating layer.

5. The semiconductor memory device according to claim 1, wherein the storage region comprises at least one material selected from the group consisting of titanium oxide, titanium nitride, and ruthenium.

6. The semiconductor memory device according to claim 1, wherein the coating layer has a substantially homogenous chemical composition.

7. The semiconductor memory device according to claim 1, wherein
a distance from the first region to the first insulating layer is less than a distance from the third region to the first insulating layer, and
a distance from the second region to the first insulating layer is less than the distance from the third region to the first insulating layer.

8. The semiconductor memory device according to claim 7, wherein the first and second regions extend from the third region towards the first insulating layer and no other portion of the storage region is between the first and second regions.

9. The semiconductor memory device according to claim 1, wherein the storage region has a horseshoe shape with an open side facing toward the first insulating layer.

10. The semiconductor memory device according to claim 1, wherein
a first portion of the coating layer is between the storage region and the first insulating layer,
a second portion of the coating layer is between the storage region and the second insulating layer, and
a third portion of the coating layer is between different parts of the storage region in a direction parallel to the channel layer.

11. A semiconductor memory device, comprising:
a stacked structure in which an interlayer insulating layer and a conductive layer are alternately stacked in a first direction;
a channel layer extending through the stacked structure in the first direction;
a first insulating layer between the channel layer and the conductive layer in a second direction intersecting the first direction;
a second insulating layer between the first insulating layer and the conductive layer in the second direction;
a storage region between the first insulating layer and the second insulating layer in the second direction and including metal or semiconductor material, the storage region including a first region, a second region, and a third region between the first region and the second region; and
a coating layer surrounding the storage region and comprising silicon and nitrogen, the coating layer being between the storage region and the second insulating layer in the second direction and between the storage region and the first insulating layer in the second direction, the coating layer contacting the first insulating layer; wherein
a thickness of the coating layer between the first region and the first insulating layer is less than a thickness of the coating layer between the third region and the first insulating layer, and
a thickness of the coating layer between the second region and the first insulating layer is less than the thickness of the coating layer between the third region and the first insulating layer.

12. The semiconductor memory device according to claim 11, wherein a material of storage region is at least one of a metal, a metal nitride, and a metal oxide.

13. The semiconductor memory device according to claim 11, wherein the storage region contains a material having a higher electron affinity or a higher work function than a material of the coating layer.

14. The semiconductor memory device according to claim 13, wherein the material of the storage region is one of titanium oxide, titanium nitride, and ruthenium.

15. The semiconductor memory device according to claim 11, wherein the coating layer has a substantially homogenous chemical composition.

16. The semiconductor memory device according to claim 11, wherein the storage region has a horseshoe shape with an open side facing toward the first insulating layer.

17. The semiconductor memory device according to claim 11, wherein the storage region does not contact the interlayer insulating layer.

18. A semiconductor memory device, comprising:
a plurality of conductive layers stacked alternately with a plurality of insulating layers;
a cylindrical semiconductor member extending through the plurality of conductive layers and the plurality of insulating layers in a first direction, a channel layer comprising a semiconductor material being on an outer peripheral surface of the cylindrical semiconductor member;
a first insulating layer being on the outer peripheral surface of the cylindrical semiconductor member between the channel layer and each of the plurality of conductive layers and the plurality of insulating layers in a second direction intersecting the first direction;
a plurality of second insulating layers between the first insulating layer and each of the conductive layers in the second direction;
a plurality of storage regions between the first insulating layer and each of the second insulating layer in the second direction and including metal or semiconductor material, each storage region including a first region, a second region, and a third region between the first region and the second region; and
a coating layer surrounding each storage region and comprising silicon and nitrogen, the coating layer being between each storage region and each second insulating layer in the second direction and between each storage region and the first insulating layer in the second direction, the coating layer contacting the first insulating layer, wherein
a thickness of each coating layer between the first region and the first insulating layer is less than a thickness of each coating layer between the third region and the first insulating layer, and
a thickness of each coating layer between the second region and the first insulating layer is less than the thickness of each coating layer between the third region and the first insulating layer.

19. The semiconductor memory device according to claim 18, wherein storage regions are a material having a higher electron affinity or a higher work function than a material of the coating layer.

20. The semiconductor memory device according to claim 18, wherein each storage region has a horseshoe shape with an open side facing toward the first insulating layer.

* * * * *